(12) United States Patent
Tien et al.

(10) Patent No.: US 10,866,506 B2
(45) Date of Patent: Dec. 15, 2020

(54) PHOTO MASK DATA CORRECTION METHOD

(71) Applicant: TAIWAN SEMICONDUCTOR MANUFACTURING CO., LTD., Hsinchu (TW)

(72) Inventors: Fu An Tien, Hsinchu (TW); Hsu-Ting Huang, Hsinchu (TW); Ru-Gun Liu, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/577,363

(22) Filed: Sep. 20, 2019

(65) Prior Publication Data
US 2020/0133115 A1  Apr. 30, 2020

Related U.S. Application Data

(60) Provisional application No. 62/753,045, filed on Oct. 30, 2018.

(51) Int. Cl.
*G03F 1/36* (2012.01)
*G03F 1/70* (2012.01)

(52) U.S. Cl.
CPC . *G03F 1/36* (2013.01); *G03F 1/70* (2013.01)

(58) Field of Classification Search
CPC ..................................... G03F 1/36; G03F 1/70
See application file for complete search history.

(56) References Cited

U.S. PATENT DOCUMENTS

| | | | |
|---|---|---|---|
| 7,383,530 B2 | 6/2008 | Wang et al. | |
| 7,676,077 B2* | 3/2010 | Kulkarni | H01L 21/67005 |
| | | | 382/144 |
| 8,631,360 B2 | 1/2014 | Wang et al. | |
| 8,739,080 B1 | 5/2014 | Tsai et al. | |
| 8,745,550 B2 | 6/2014 | Cheng et al. | |
| 8,898,606 B1* | 11/2014 | Abou Ghaida | G06F 30/398 |
| | | | 716/111 |
| 8,935,643 B2* | 1/2015 | Salem | G06F 30/398 |
| | | | 716/112 |
| 8,972,908 B2 | 3/2015 | Chen et al. | |
| 9,053,527 B2* | 6/2015 | Lang | G01N 21/8851 |
| 9,170,211 B2* | 10/2015 | Kulkarni | G01N 21/9501 |
| 9,367,655 B2 | 6/2016 | Shih et al. | |
| 9,390,217 B2 | 7/2016 | Wang et al. | |

(Continued)

*Primary Examiner* — Nha T Nguyen
(74) *Attorney, Agent, or Firm* — McDermott Will & Emery LLP

(57) ABSTRACT

A method for manufacturing a photo mask for a semiconductor device includes receiving a plurality of hotspot regions of a mask layout corresponding to the semiconductor device. The method further includes classifying the plurality of hotspot regions into two or more hotspot groups such that same or similar hotspot regions are classified into same hotspot groups. The hotspot groups includes a first hotspot group that has at least two hotspot regions. The method also includes correcting a first hotspot region of the first hotspot group to generate an enhancement of the first hotspot region and correcting other hotspot regions of the first hotspot group using the enhancement of the first hotspot region to generate enhancements of other hotspot regions of the first hotspot group.

20 Claims, 8 Drawing Sheets

(56) References Cited

U.S. PATENT DOCUMENTS

| | | | |
|---|---|---|---|
| 9,443,051 B2* | 9/2016 | Benware | G06F 30/398 |
| 9,626,459 B2* | 4/2017 | Agarwal | G06K 9/6269 |
| 9,679,100 B2 | 6/2017 | Cheng et al. | |
| 10,621,302 B2* | 4/2020 | Sha | G03F 7/70433 |
| 2007/0052963 A1* | 3/2007 | Orbon | G03F 1/84 |
| | | | 356/430 |
| 2009/0271749 A1* | 10/2009 | Tang | G06F 30/398 |
| | | | 716/106 |
| 2009/0300561 A1* | 12/2009 | Tong | G06F 30/398 |
| | | | 716/106 |
| 2010/0280812 A1* | 11/2010 | Zhang | G03F 7/70625 |
| | | | 703/13 |
| 2011/0283244 A1 | 11/2011 | Abdo et al. | |
| 2013/0125070 A1* | 5/2013 | Bai | G03F 1/72 |
| | | | 716/52 |
| 2014/0114634 A1 | 4/2014 | Song et al. | |
| 2014/0220786 A1 | 8/2014 | Lukanc et al. | |
| 2014/0358830 A1* | 12/2014 | Chiang | G06K 9/4642 |
| | | | 706/12 |
| 2015/0112649 A1* | 4/2015 | Agarwal | G03F 7/70441 |
| | | | 703/2 |
| 2015/0113486 A1 | 4/2015 | Wang | |
| 2015/0213374 A1* | 7/2015 | Agarwal | G06K 9/6269 |
| | | | 706/12 |
| 2016/0132627 A1* | 5/2016 | Tsai | G03F 1/78 |
| | | | 716/53 |
| 2018/0018542 A1* | 1/2018 | Ma | G06K 9/6201 |
| 2019/0072858 A1* | 3/2019 | Saraswatula | G03F 7/7065 |
| 2019/0087526 A1* | 3/2019 | Park | G06F 30/18 |
| 2019/0102507 A1* | 4/2019 | Tan | G06F 30/398 |

* cited by examiner

PHOTO MASK DATA CORRECTION METHOD

PRIORITY CLAIM AND CROSS-REFERENCE

This application claims priority to U.S. Provisional Application No. 62/753,045 filed on Oct. 30, 2018, entitled "Photomask Data Correction Method," the entire disclosure of which is incorporated herein by reference.

BACKGROUND

During an integrated circuit (IC) design, a number of IC layouts of the IC, for different steps of IC processing, are generated. The layouts include geometric shapes corresponding to structures to be fabricated on a wafer. The layouts may be masks layouts that are projected, e.g., imaged, on the wafer to create the IC. A lithography process transfers a pattern of a mask layout to the wafer such that etching, implantation, or other steps are applied only to predefined regions of the wafer. Transferring the pattern of the mask layout to the wafer may cause mask layout data defects that are a major challenge in semiconductor manufacturing. An optical proximity correction (OPC) operation may be applied to reduce photo mask layout data defects. Photo mask layout data defects after OPC operation are corrected one at a time. Correcting each defect, one at a time, is very time consuming. An efficient mask layout data correction process is desirable for optical and non-optical lithography.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
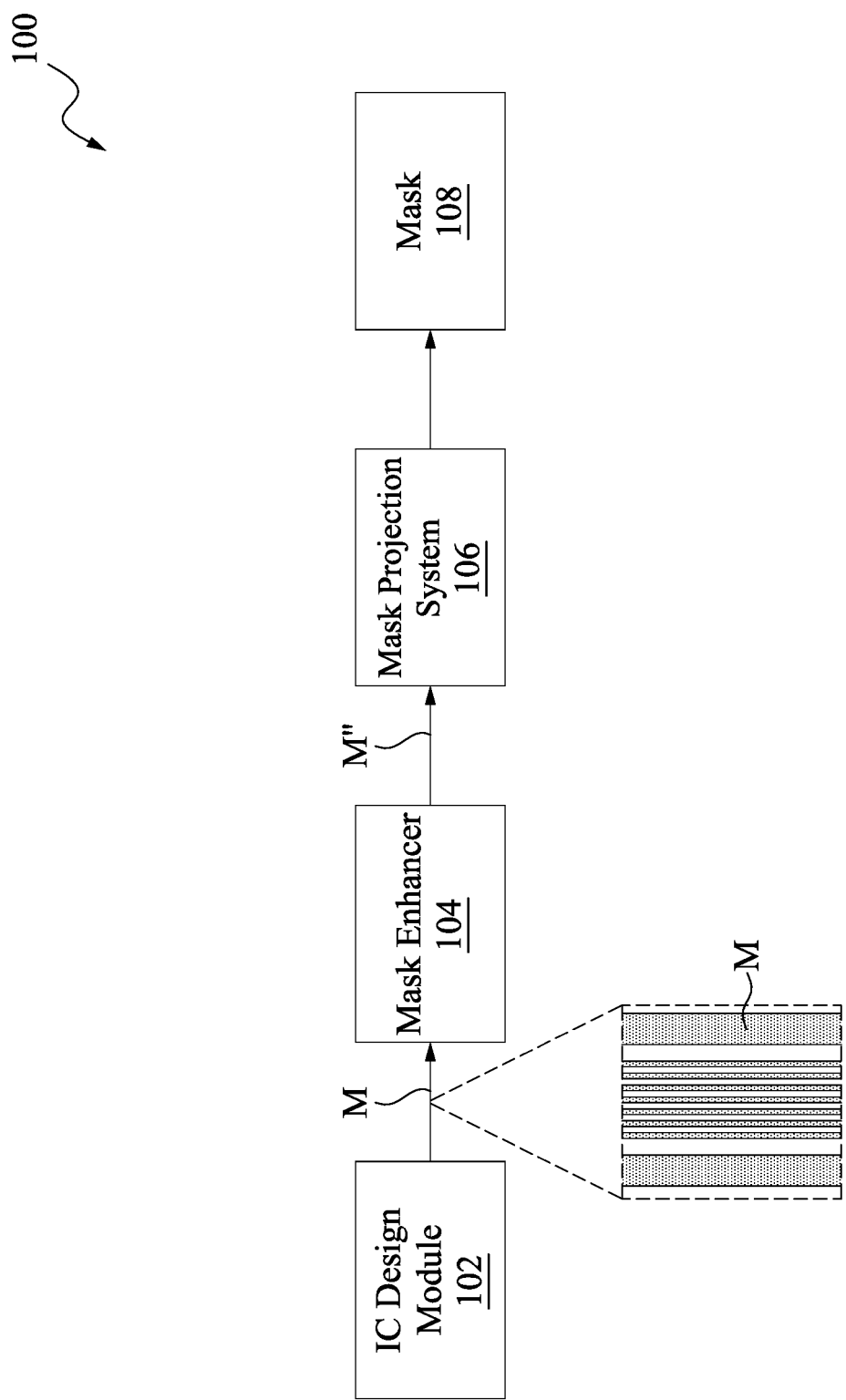
FIG. 1 illustrates a schematic diagram of an exemplary integrated circuit (IC) fabrication flow in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In IC design, lithography simulation is used to predict the image of the photo mask layout created on the wafer. Such simulations can be used for example to assess the quality of the images, to discover defects, or to perform corrections of the photo mask pattern using OPC. The OPC is used to achieve images close to the target circuit patterns, to optimize the printing parameters such as the illumination source, or optimize the source and the photo mask to achieve better printability. The evaluation of the mask layout design can include identifying "hotspots", which are areas of the photo mask that may produce defects, e.g., pattern bridges, on the wafer. An IC layout contour can be generated based on the IC design layout. The generation of an IC layout contour is a process to simulate the IC device and to generate its physical dimensions and geometries based on its design layout.

It is more challenging to form a photo mask layout for ICs having smaller feature sizes. The proximity of the layout features for smaller feature sizes may cause optical distortion when imaged on the wafer. Image features whose size and/or separation approach the resolution limit of the radiation source of lithography, will thus be subject to distortion. In some embodiments, the proximity effect can be compensated for, at least in part, by modifying any given feature in the opposite direction to the expected distortion.

OPC is one lithography technique used to tune (e.g., correct or enhance) the mask layout for improved imaging effect. The objective of the OPC process is to reproduce on the wafer, the original layout drawn by the IC designer. For example, OPC can be used to compensate for image errors due to optical diffraction or process effects. OPC helps to maintain the edge of the original mask layout in the patterned image on the wafer. If not compensated, after processing, the images patterned on the wafer can appear with irregularities such as line widths that are narrower or wider than designed. OPC can compensate for such irregularities by changing (e.g., correcting) the pattern of the mask layout. OPC is described in more details in application Ser. No. 15/812,826, the entire disclosure of which is incorporated herein by reference.

After OPC is performed to make the adjustments to the mask layout, the modified layout may need inspection. Inspection can be performed to identify highlighted areas (hotspots) of the OPCed mask layout that may not be properly printed on the wafer and may produce defective areas on the wafer, e.g., areas on the wafer that pinching (open circuit) and/or bridging (short circuit) may occur.

In some embodiments, after inspecting the mask layout and finding the hotspots, the hotspots are fixed, e.g., corrected or enhanced. The hotspots are regions of the mask layout that may produce the defective areas on the wafer after performing the lithographic process to produce the mask layout on the wafer. Therefore, to remedy the problem of creating the defective areas, an inverse of the lithographic process, inverse lithographic technology (ILT), may be applied to the mask layout. In some embodiments, the lithographic process is not linear and ILT is performed by an iterative process. Thus, the mask layout may be corrected by applying the ILT through an iterative process. The iterative process may start from an initial enhancement to the mask layout and may be executed for some iterations to reach a target enhancement to the mask layout such that the mask layout with the target enhancement produces no defective areas on the wafer. In some embodiments, the iterative process is very robust and may even start from a random initial enhancement that includes random numbers. However, starting from a random initial enhancement may take several iterations to reach to the target enhancement. Thus, implementing ILT on every hotspot using separate iterative processes starting from random initial enhancements, e.g., without knowledge about the initial enhancements, may be time consuming.

In some embodiments, the hotspots of the mask layout are categorized, e.g., classified, into a number of groups where each group has the same or similar type of hotspots. Then, in each group, a seed, a single hotspot, is selected and the ILT is iteratively performed on the seed from a random initial enhancement, and for several iterations to reach the target enhancement to mask layout. Since the hotspots of each group are the same or similar to the seed of that group, the ILT can be iteratively performed on the rest of the hotspots of each group starting from an initial enhancement equal to the target enhancement of the seed of the group. Thus, performing ILT iteratively for the rest of the hotspots of each group takes a fewer number of iterations compared to the number iterations used for the seed of the group in some embodiments. Using the similarity of the hotspots to put the hotspots in different groups and then using this similarity to perform ILT iteratively, provides a much faster correction of the hotspots in some embodiments. In some embodiments, neighboring hotspots are combined into a hotspot region and similar hotspot regions are grouped together in a hotspot group. Thus a seed may be a hotspot region of a hotspot group. The ILT may iteratively be performed on the seed, e.g., a seed region, of each hotspot group and then the ILT may iteratively be performed on the other hotspot regions of the hotspot group as described above. In some embodiments, one or more features are defined for the hotspot groups and a similarity measure is defined based on the features for each hotspot. Thus, the similarity measures of the hotspots are calculated and then the hotspots may be ordered according to the similarity measures. In some embodiments, the features of the hotspot groups are length, width, and/or area of the hotspot. In some embodiments, the features of hotspot groups include a density of layout lines in the hotspot and/or a percentage of coverage of the hotspot area by the layout lines.

FIG. 1 illustrates a schematic diagram of an integrated circuit (IC) fabrication flow 100 in accordance with some embodiments. IC fabrication flow 100 is one example of an IC fabrication flow in which the post OPC verification techniques using machine learning approaches for applying classification on a mask layout are used.

The IC fabrication flow 100 begins with an IC design module 102 that provides mask layouts M for producing an IC product. The IC design module 102 creates various mask layouts, e.g., geometrical patterns, based on the specification of the IC product and for different steps of processing the IC product. In some embodiments, mask layouts M are presented by one or more data files having the information of the geometrical patterns. In some embodiments, the mask layouts M are created as photo mask of the geometrical patterns. The IC fabrication flow 100 includes mask enhancer 104. As described in more detail below with respect to FIG. 2, the mask enhancer 104 performs OPC and post-OPC defect detection in some embodiments. The post-OPC defect detection is followed by further corrections to the mask layouts after performing OPC in some embodiments. The Mask enhancer 104 creates an enhanced mask layout M". In some embodiments, the enhanced mask layout M" is presented by one or more data files having the information of enhanced geometrical patterns. In some embodiments, the enhanced mask layout M" are created as photo mask of the enhanced geometrical patterns.

The IC fabrication flow 100 further includes a mask projection system 106. In some embodiments, the mask projection system 106 produces the enhanced photo mask layouts M" from the data files and then optically projects the enhanced photo mask layouts M" on the wafer 108 to produce the ICs on the wafer 108. In some embodiments, the mask projection system 106 may use the data files of the enhanced mask layout M" and projects, e.g., by an electron beam, the enhanced mask layout M" on a mask blank (not shown) coated with a photo resist to produce a photo mask for the ICs.

Figure 2:
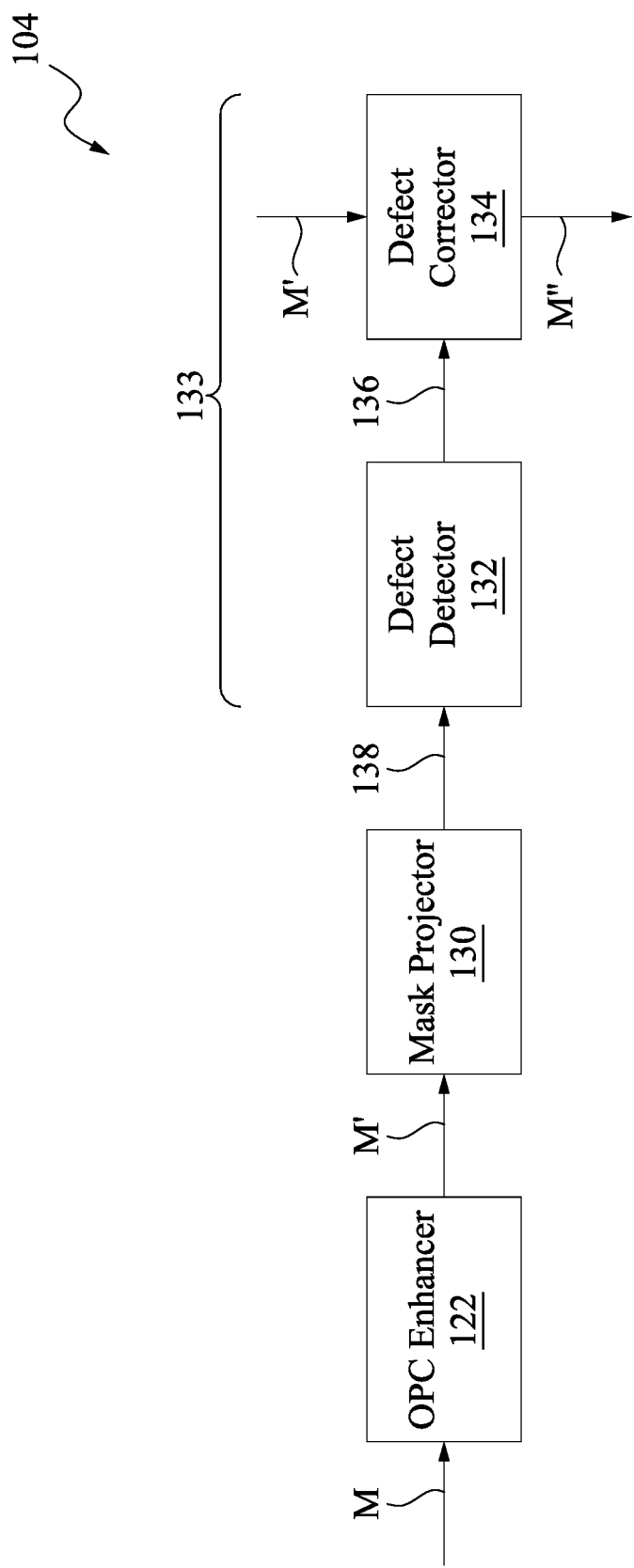
FIG. 2 illustrates a schematic diagram of an exemplary mask enhancer for enhancing photo mask layouts in accordance with some embodiments of the disclosure.

FIG. 2 illustrates a schematic diagram of an exemplary mask enhancer 104 for enhancing photo mask layouts in accordance with some embodiments. Some embodiments of mask enhancer 104 include an OPC enhancer 122 that receives the mask layout M that is produced by the IC design module 102 and produces the OPCed (e.g., the corrected) mask layout M'. As described, OPC is a lithography technique that is used to correct or enhance the mask layout M, and produce improved imaging effects to reproduce, on the wafer 108, the original layout drawn by the IC design module 102. For example, OPC can be used to compensate for imaging distortions due to optical diffraction. In some embodiments, the mask layout M is a data file having the information of the geometrical patterns to be produced on the wafer 108, and the OPC enhancer 122 modifies the data file and produces a corrected data file representing a corrected mask layout M'.

Then, a mask projector 130 is applied on the corrected mask layout M' to produce a projected mask layout 138 on the wafer. In some embodiments, corrected mask layout M' is a data file and the mask projector 130 simulates the projection of the corrected mask layout M' on the wafer and produces the simulated projected mask layout 138. The defect detector 132 of the mask enhancer 104 inspects the projected mask layout 138 and finds the defective areas 136 of the projected mask layout 138. Although, the corrected mask layout M' is OPCed, defective areas may be produced when the corrected mask layout M' is projected on the wafer 108. The defective areas are described with respect to FIGS. 3A and 3B.

In some embodiments, a defect corrector 134 of the mask enhancer 104 receives the defective areas 136 and the corrected mask layout M' and implements further correction, e.g., enhancement, on the corrected mask layout M', thereby producing the enhanced mask layout M". The defect corrector 134 is described in more details with respect to FIG. 5. In some embodiments, defect detector 132 may be combined into the defect corrector 134 creating a layout detection and correction system 133 that receives the projected mask layout 138 and the corrected mask layout M' and provides the enhanced mask layout M".

Figure 3B:
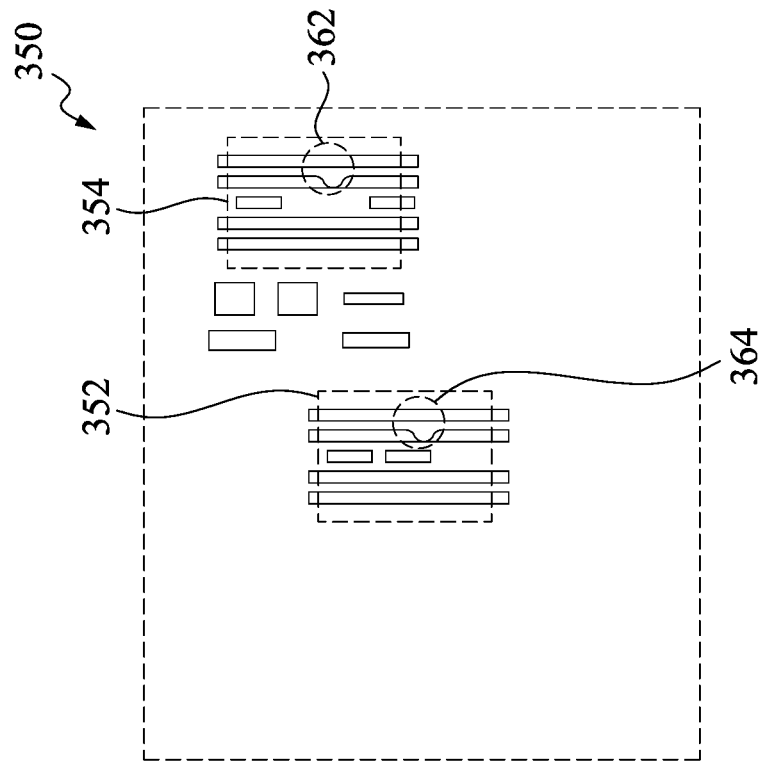
FIGS. 3A and 3B illustrate exemplary layout contours having two defective areas in accordance with some embodiments of the disclosure.
Figure 3A:
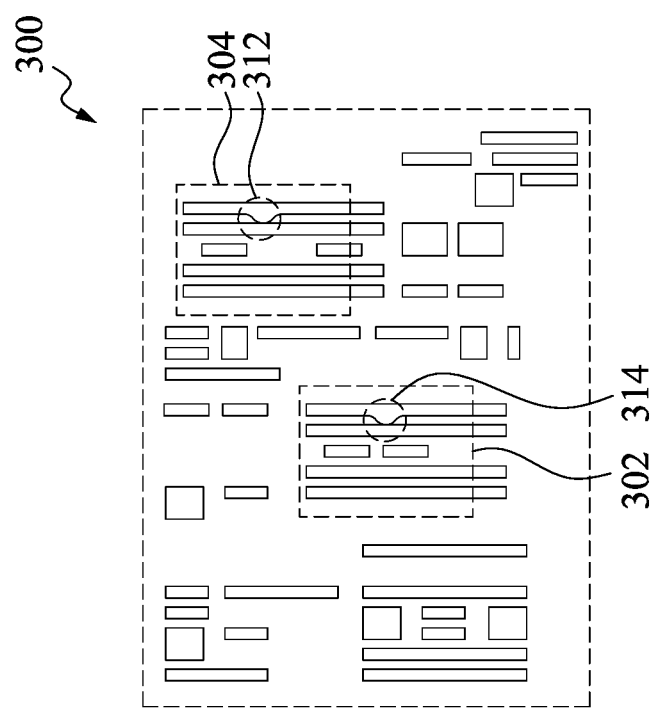

FIG. 3A illustrates an exemplary layout contour 300 having two defective areas 302 and 304 in accordance with some embodiments. The layout contour 300 may be produced by the mask projector 130 when the corrected mask layout M', after being OPCed, is projected on the wafer 108, disclosed herein. As shown, both of the defective areas 302, 304 include a bridging 312 and 314 (e.g., short circuits) that are connections between adjacent layout lines in the middle of the defective areas 302 and 304. The defective areas 302 and 304 may be back projected to two corresponding hotspots in the corrected mask layout M'. In some embodiments, each defective area corresponds to a hotspot on corrected mask layout M'. Because the defective areas 302 and 304 are neighboring defective areas, the two corresponding hotspots are also neighboring hotspots and may be combined into a single hotspot region.

FIG. 3B illustrates an exemplary layout contour 350 having two defective areas 352 and 354 in accordance with some embodiments. The layout contour 350 may be produced by the mask projector 130 when the corrected mask layout M', after being OPCed, is projected on the wafer 108, disclosed herein. As shown, both of the defective areas 352, 354 include a pinching 362 and 364 (e.g., open circuits) of the layout lines that creates a disconnection in the middle of the defective areas 352 and 354. The defective areas 352 and 354 may be back projected to two corresponding hotspots in the corrected mask layout M'. Because the defective areas 352 and 354 are neighboring defective areas, the two corresponding hotspots are also neighboring hotspots and may be combined into a single hotspot region.

Figure 4:
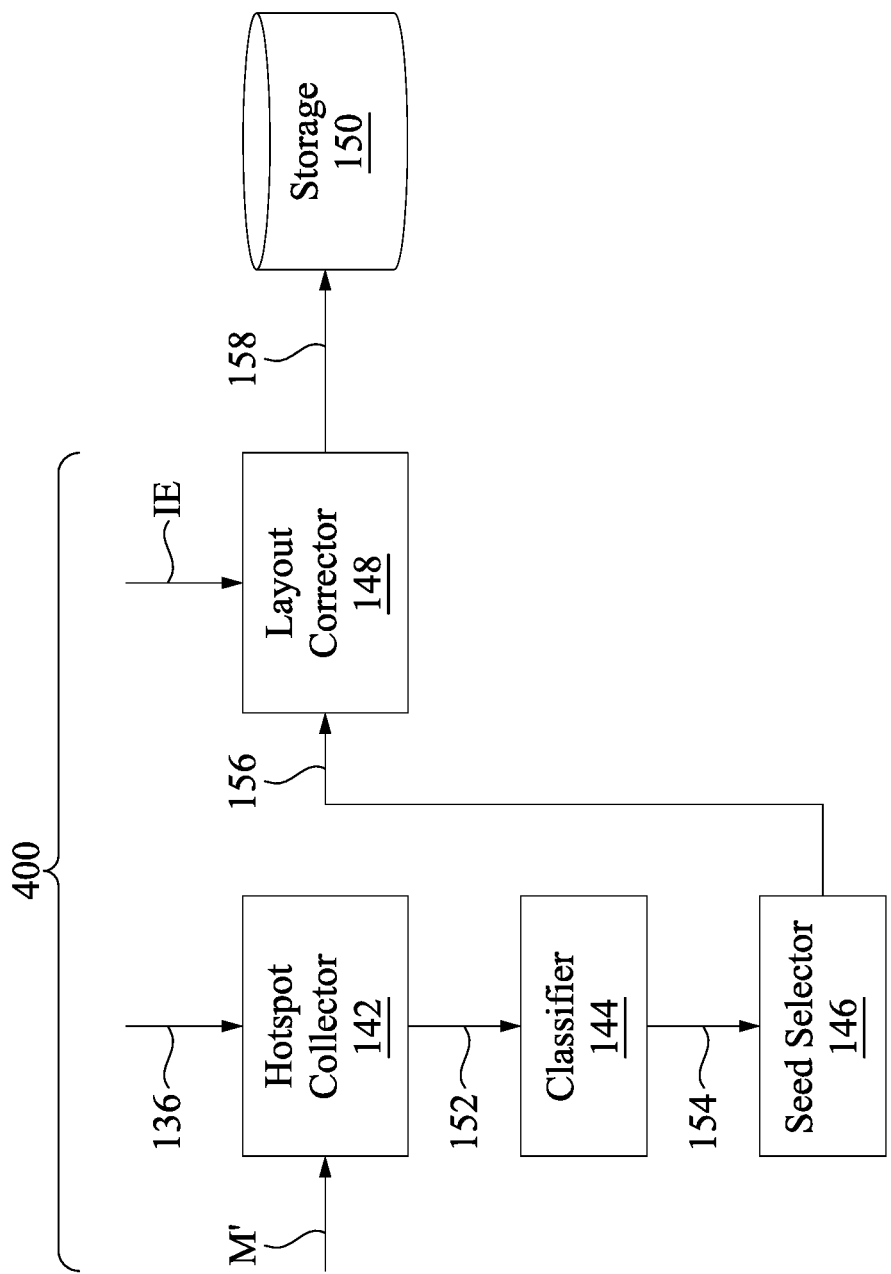
FIG. 4 illustrates a schematic diagram of an exemplary system for enhancing mask layouts in accordance with some embodiments of the disclosure.

FIG. 4 illustrates a schematic diagram of an exemplary system for enhancing mask layouts in accordance with some embodiments. FIG. 4 illustrates an initial system 400 that includes a hotspot collector 142. The hotspot collector 142 receives the defective areas 136 and the corrected (e.g., OPCed) mask layout M'. The hotspot collector 142 determines the hotspots of the corrected mask layout M' that correspond to the defective areas 136. The hotspot collector 142 combines the neighboring hotspots into hotspot regions 152 and produces (or identifies) a plurality of hotspot regions 152 of the corrected mask layout M'. Thus, the hotspot regions 152, when projected on the wafer 108, create one or more neighboring defective areas, in some embodiments.

In some embodiments, a classifier 144 receives the plurality of hotspot regions 152 of the corrected mask layout M' and classifies (or group) the plurality of hotspot regions 152 into a plurality of hotspot groups 154. The plurality of hotspot regions 152 may be grouped together such that the same or similar hotspot regions 152 are classified into the same hotspot groups 154. The classifier 144 may use one or more features of the hotspot regions 152 for classifying the hotspot regions. In some embodiments, the classifier 144 groups the hotspot regions 152 based on the type of defective area formed on the wafer, e.g., bridging, pinching, etc.

In some embodiments, a seed selector 146 receives the plurality of hotspot groups 154 where each hotspot group includes one or hotspot regions 152 as shown in FIG. 4. In some embodiments, the seed selector 146 selects one of the hotspot regions 152 as the seed. Thus, the seed selector 146 may generate a plurality of seeds 156 where each seed 156 is associated with one of the hotspot groups 154. In some embodiments, the seed 156 of each the hotspot group 154 is selected based on the features that were used to classify the hotspot regions 152 into the hotspot groups 154. In some embodiments, the seed 156 of each hotspot group 154 is selected such that, based on the parameters of the features, the seed 156 is closer than other hotspot regions 152 to the average of the parameters of the features of the hotspot group 154.

In some embodiments, a layout corrector 148 receives, as an input, the plurality of seeds 156 to be enhanced and provides layout enhancements 158 of the seeds as an output. As described, the seeds 156 are hotspot regions 152 of the hotspot groups 154 that when projected on the wafer 108 create one or more defective areas on the wafer 108. In some embodiments, the layout corrector 148 corrects (or enhances) seeds 156 of the hotspot group 154 of the corrected mask layout M' and generates the layout enhancement 158 for the seeds 156 of the hotspot groups 154. Thus, the enhanced seeds, seeds 156 incorporating the layout enhancement 158, do not cause defective areas when projected on the wafer 108, in some embodiments. In some embodiments, the layout enhancement 158 of each seed 156 of the hotspot groups 154 are stored in a storage 150. In some embodiments, the hotspot collector 142, the classifier 144, the seed selector 146, and the layout corrector 148 are combined into the initial system 400 that receives the corrected (OPCed) mask layout M', the defective areas 136, and a predetermined initial enhancements IE of the layout corrector 148 and generates the layout enhancement 158 of each seed 156 of the hotspot groups 154. In some embodiments, the layout corrector 148 uses an iterative process for generating the layout enhancements 158 of the seeds 156. The iterative process may start with the initial enhancement IE for each seed that may be a same random initial enhancement. The layout corrector 148 is described with respect to FIG. 6.

Figure 5:
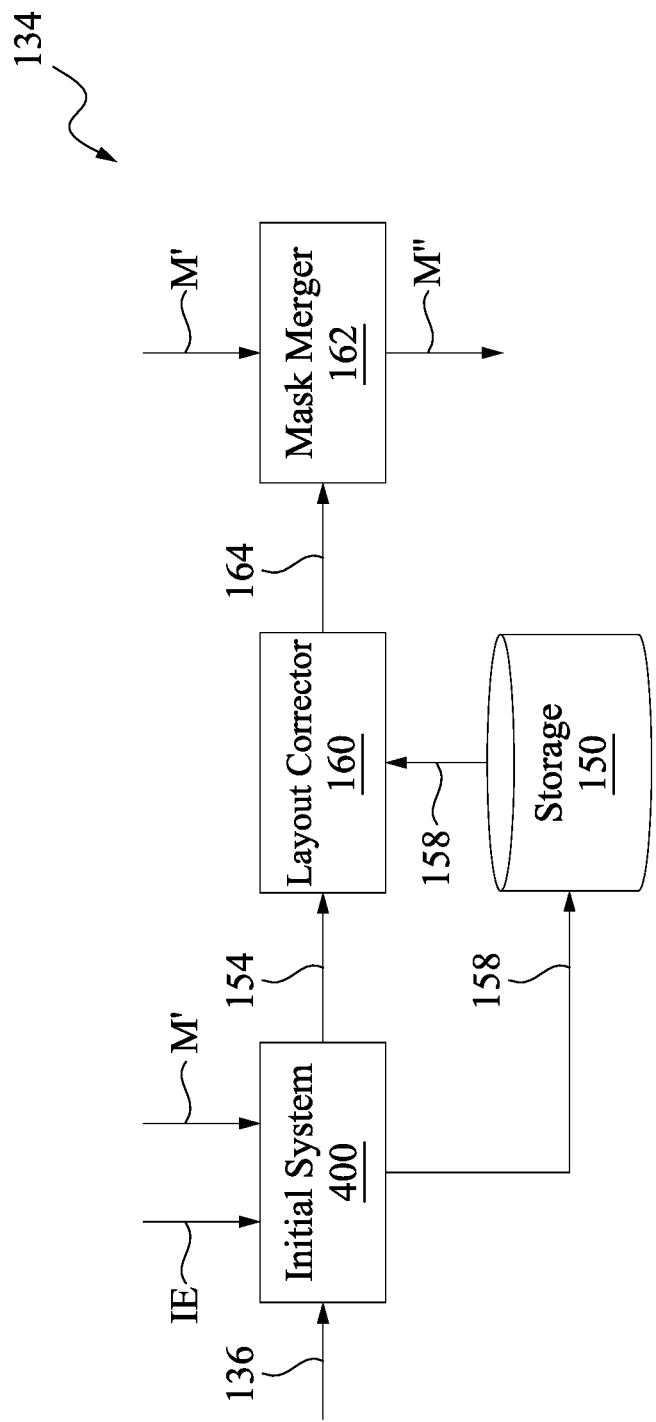
FIG. 5 illustrates a schematic diagram of an exemplary defect corrector in accordance with some embodiments of the disclosure.

FIG. 5 illustrates a schematic diagram of an exemplary defect corrector 134 for enhancing mask layouts in accordance with some embodiments. The defect corrector 134 includes the initial system 400 illustrated in FIG. 4 that receives the corrected mask layout M', the defective areas 136, and the initial enhancements IEs for the seeds 156 of the hotspot groups 154. The initial system 400 generates the layout enhancements 158 for the seeds 156 of the hotspot groups 154. As described, the layout enhancement 158 of each seed 156 of the hotspot groups 154 is stored in the storage 150 of the defect corrector 134, in some embodiments. The initial system 400 also generates the hotspot groups 154 that each hotspot group 154 includes one or more hotspot regions 152 in some embodiments.

The defect corrector 134 also includes a layout corrector 160 that is consistent with the layout corrector 148 of FIG. 4. The layout corrector 160 receives the hotspot groups 154 from the initial system 400. In some embodiments, the layout corrector 160 receives the hotspot regions 152 of the hotspot groups 154, excluding the seed 156 of the hotspot groups 154. In addition, for each hotspot region 152 of each hotspot group 154, the layout corrector 160 retrieves the layout enhancement 158 of the corresponding seed 156 of the hotspot groups 154 from the storage 150. The layout corrector 160 may use the layout enhancement 158 of the corresponding seed 156 of the hotspot groups 154 as the initial enhancement for correcting the other hotspot regions 152 of the hotspot groups 154. Thus, for each hotspot group 154, the layout enhancement 158 of the seed 156 of the hotspot group 154 exists in the storage 150. Then, the layout corrector 160 uses the layout enhancement 158 of the seed 156 corresponding to each one of the hotspot group 154 to correct the other hotspot regions 152 of the hotspot group 154. The layout corrector 160 may provide as an output, the layout enhancements 164 that includes the layout enhancements for each hotspot region 152, including the seed 156, of each hotspot group 154. Similar to the seeds 156, the enhanced hotspot regions, by incorporating the layout enhancements 164 to hotspot regions 152, do not cause defective areas when projected on the wafer 108, in some embodiments.

The defect corrector 134 also includes a mask merger 162. In some embodiments, the mask merger 162 receives the layout enhancements 164 and incorporates the layout enhancements 164 to the corrected mask layout M' to provide the enhanced mask layout M". In some embodiments, the layout corrector 160 uses an iterative process for generating the layout enhancements 164 of the other hotspot regions 152 of the hotspot groups 154. The layout corrector 160 uses the layout enhancement 158 of the seed 156 of each hotspot group 154 as the initial enhancement of the iterative process to correct the other hotspot regions 152 of each hotspot group 154. In some embodiments, the defect corrector 134 receives mask the layout M instead of the corrected mask layout M' and the initial system 400 receives the defective areas when the mask layout M is projected on the wafer 108. The layout corrector 160 may provide layout enhancements for the mask layout M and the mask merger 162 may incorporate the layout enhancements to the mask layout M. The layout corrector 160, which is consistent with the layout corrector 148 is further described with respect to FIG. 6.

In some embodiments, the plurality of hotspot regions 152 are grouped into a plurality of hotspot groups 154 such that each hotspot group 154 includes the same or similar hotspot regions 152. Then, in each hotspot group 154, a seed 156 is selected by the seed selector 146 of FIG. 4 and the seed 156 is corrected by the layout corrector 148 of FIG. 4 to generate the layout enhancement 158 for the seed 156 of the hotspot group 154. Then, the layout enhancements 158 for the seeds 156 of the hotspot groups 154 are stored in the storage 150. In the next step, for each hotspot group 154, the layout corrector 160 retrieves the layout enhancements 158 of the seeds 156 of the hotspot group from the storage 150 and performs the correction to the other hotspot regions 152 of the same hotspot group using the layout enhancements 158 for the seed 156 of the same group. When the seed 156 of each hotspot group 154 is the same or similar to the other hotspot regions 152 of the same hotspot group 154, the correction of the other hotspots 152 of the same hotspot group 154 is rapidly performed.

Figure 6:
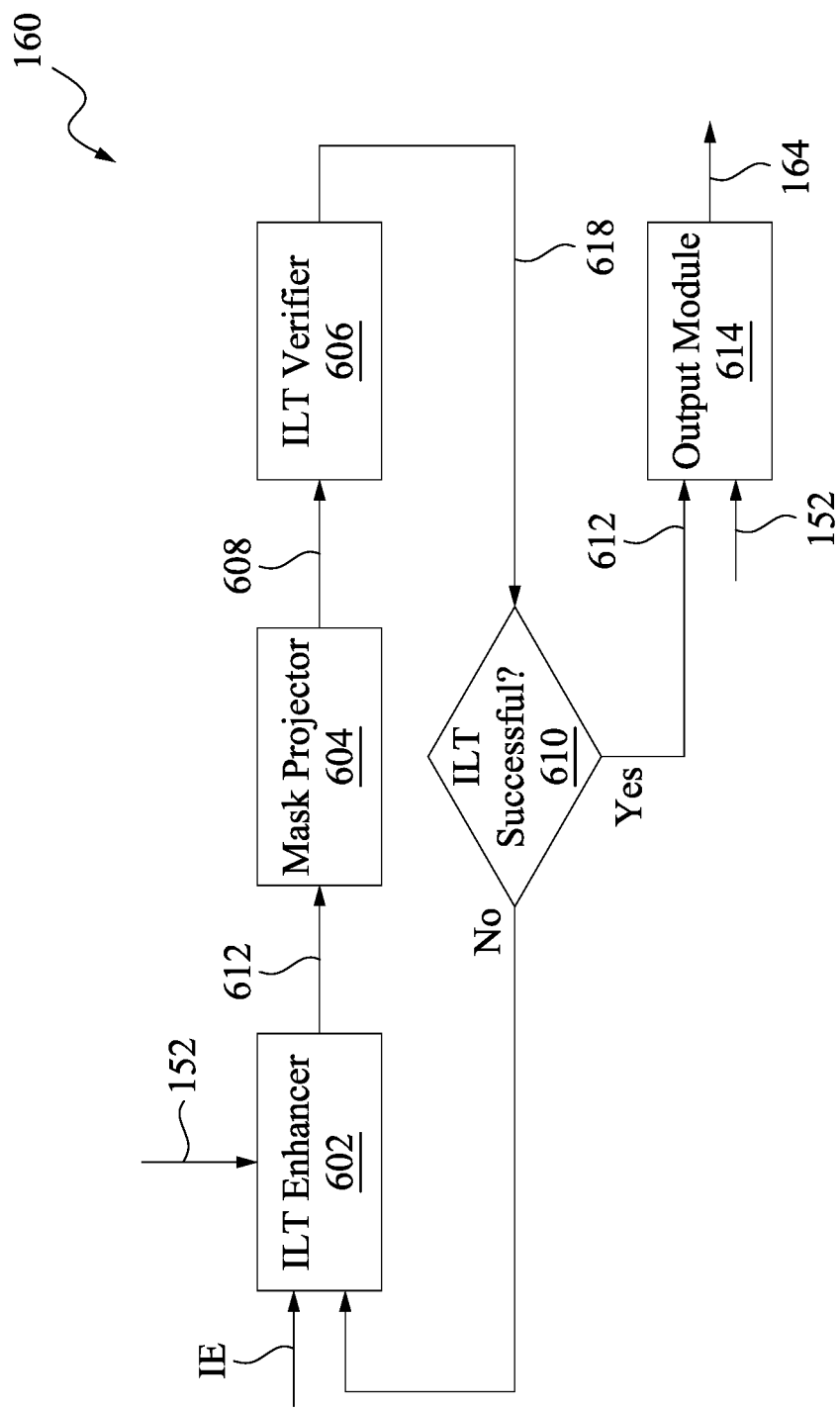
FIG. 6 illustrates a schematic diagram of an exemplary layout corrector in accordance with some embodiments of the disclosure.

FIG. 6 illustrates a schematic diagram of an exemplary layout corrector 160 for performing ILT enhancement in accordance with some embodiments. The layout corrector 160 performs an iterative process. The layout corrector 160 includes an ILT enhancer 602 that receives the initial enhancement IE and one or more hotspot regions 152. The hotspot regions 152 that are input to the ILT enhancer 602 may be the seeds 156 of the hotspot groups 154 or may be the other hotspot regions 152 of hotspot groups 154. In some embodiments, when the seed 156 of the hotspot groups 154 is the input of the ILT enhancer 602, the initial enhancement IE is a predetermined initial enhancement or a random initial enhancement. In some embodiments, when other hotspot regions 152 (other than the seed 156) of the hotspot group 154 are the input of the ILT enhancer 602, the initial enhancement IE is a layout enhancement of the seed 156 consistent with the layout enhancement 158. Then, the ILT enhancer 602 performs the initial enhancement IE to the received hotspot regions 152 and creates the iteration results 612. The iteration result 612 is projected by the mask projector 604 on the wafer 108 to create a projected mask layout 608. In some embodiments, the mask projector 604 performs a simulated projection. The projected mask layout 608 is inspected by an ILT verifier 606 for defective areas. A verification outcome 618 is tested at step 610 and if the verification outcome 618 is not successful, e.g., defective areas exist, the iterations continue by modifying the layout enhancement at the ILT enhancer 602. The iterations continue until the verification outcome 618 is successful and the projected mask layout 608 does not have any defective areas. When the verification outcome 618 is successful, an output module 614 outputs the difference between the iteration result 612 and the input hotspot region 152. The difference between the iteration result 612 and the input hotspot region 152 is the layout enhancement 164 that is provided by the layout corrector 160.

In some embodiments, the plurality of hotspot regions 152 generate a plurality of defective areas when the corrected mask layout M' is projected on the wafer 108. Conversely, in some embodiments, the enhanced mask layout M" does not generate a defective area when projected on the wafer 108.

Figure 7:
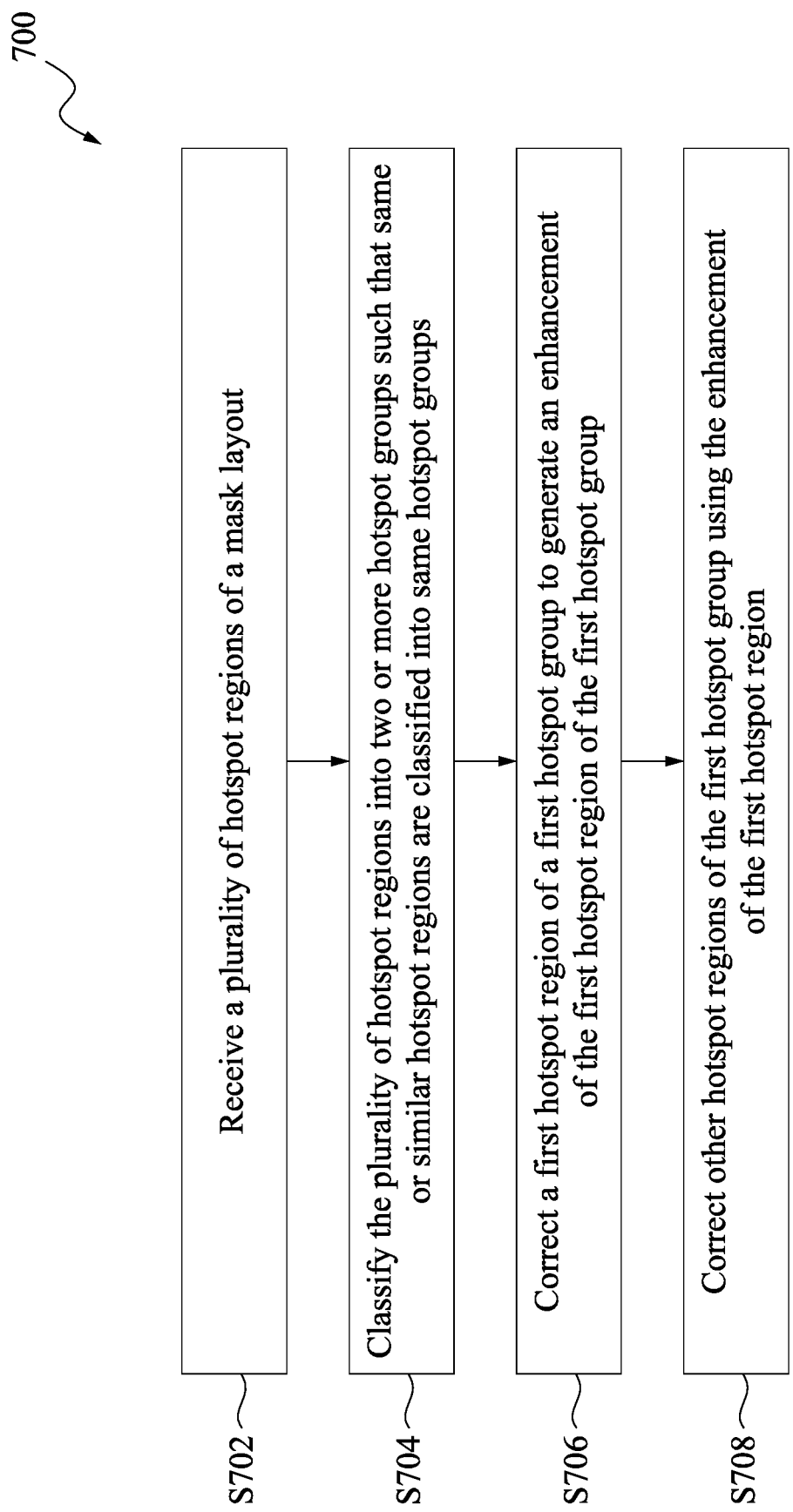
FIG. 7 illustrates a flow diagram of an exemplary process for correcting mask layouts according to some embodiments of the disclosure.

FIG. 7 illustrates a flow diagram of a method 700 of correcting mask layouts according to some aspects of the disclosure. The method includes the operation S702 of receiving a plurality of hotspot regions of a mask layout. For example, the classifier 144 of FIG. 4 receives the hotspot regions 152 of the corrected mask layout M'. Then, in operation S704, the plurality of hotspot regions are classified into two or more hotspot groups. For example, as shown in FIG. 4, the classifier 144 classifies the hotspot regions 152 into the hotspot groups 154. In some embodiments, the same or similar hotspot regions 152 are classified into the same hotspot groups 154. In operation S706, a first hotspot region of a first hotspot group is corrected to generate an enhancement of the first hotspot region of the first hotspot group. For example, the first hotspot region 152 of the first hotspot group 154 is selected by the seed selector 146 as the seed 156. Then an enhancement for the seed 156 is generated by the layout corrector 148 of FIG. 4 such that a layout enhancement 158 for the seed 156 is provided. In operation S708, other hotspot regions 152 of the first hotspot group 154 are corrected. The other hotspot regions 152 of the first hotspot group 154 are corrected using the layout enhancement 158 of the seed 156 of the same group.

Figure 8A:
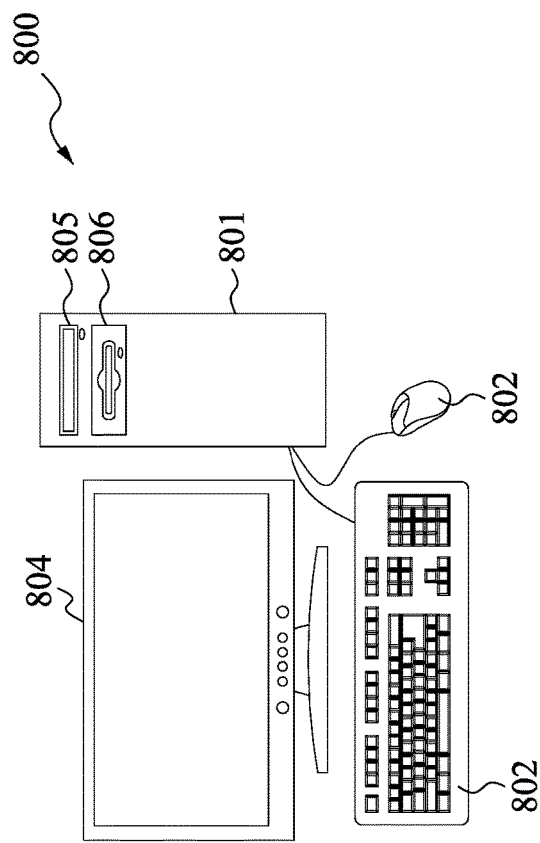
FIGS. 8A and 8B illustrate a photo mask data generating apparatus according to some embodiments of the present disclosure.
Figure 8B:
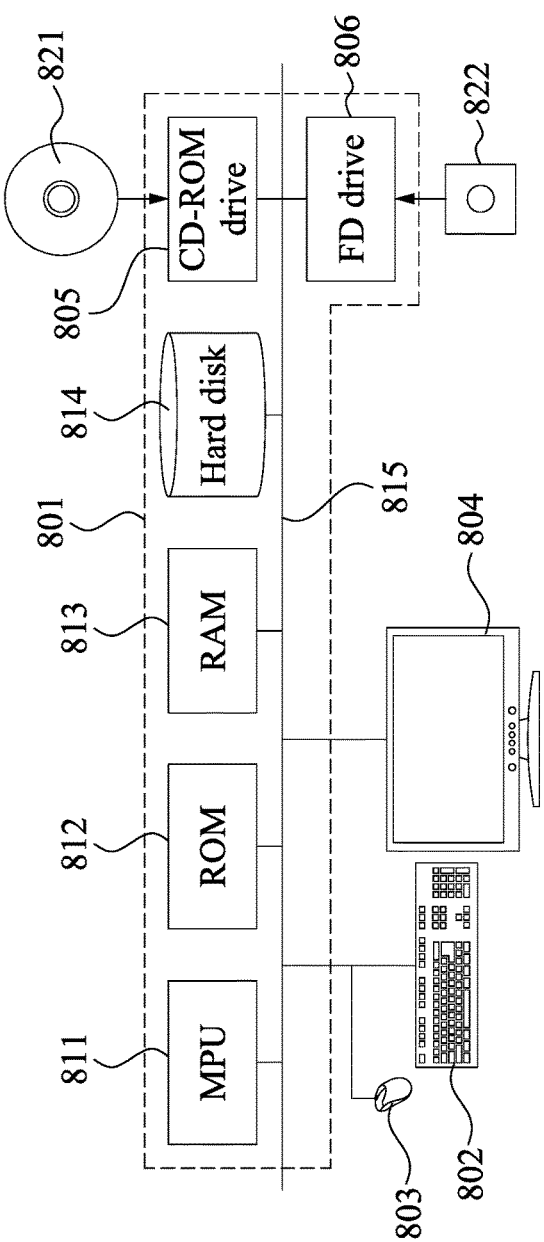

FIGS. 8A and 8B illustrate a photo mask data generating apparatus according to some embodiments of the present disclosure. FIG. 8A is a schematic view of a computer system that executes the photo mask data generating process according to one or more embodiments as described above. All of or a part of the processes, method and/or operations of the foregoing embodiments can be realized using computer hardware and computer programs executed thereon. The operations include OPC enhancement, mask projection, defect detection, and defect correction. In FIG. 8A, a computer system 800 is provided with a computer 801 including an optical disk read only memory (e.g., CD-ROM or DVD-ROM) drive 805 and a magnetic disk drive 806, a keyboard 802, a mouse 803, and a monitor 804.

FIG. 8B is a diagram showing an internal configuration of the computer system 800. In FIG. 8B, the computer 801 is provided with, in addition to the optical disk drive 805 and the magnetic disk drive 806, one or more processors 811, such as a micro processing unit (MPU), a ROM 812 in which a program such as a boot up program is stored, a random access memory (RAM) 813 that is connected to the MPU 811 and in which a command of an application program is temporarily stored and a temporary storage area is provided, a hard disk 814 in which an application program, a system program, and data are stored, and a bus 815 that connects the MPU 811, the ROM 812, and the like. Note that the computer 801 may include a network card (not shown) for providing a connection to a LAN.

The program for causing the computer system 800 to execute the functions of the photo mask data generating and merging apparatus in the foregoing embodiments may be stored in an optical disk 821 or a magnetic disk 822, which are inserted into the optical disk drive 805 or the magnetic disk drive 806, and transmitted to the hard disk 814. Alternatively, the program may be transmitted via a network (not shown) to the computer 801 and stored in the hard disk 814. At the time of execution, the program is loaded into the RAM 813. The program may be loaded from the optical disk 821 or the magnetic disk 822, or directly from a network. The program does not necessarily have to include, for example, an operating system (OS) or a third party program to cause the computer 801 to execute the functions of the photo mask data generating and merging apparatus in the foregoing embodiments. The program may only include a command portion to call an appropriate function (module) in a controlled mode and obtain desired results.

According to embodiments of the present disclosure, the same or similar photo mask layout hotspot regions are grouped together and then a first hotspot region is corrected. The results of correcting the first hotspot region is subsequently used to correct each of the same or similar defective areas, thereby significantly reducing the turn-around time for performing correction of photo mask layout hotspot regions. In some embodiments, inverse lithographic technology (ILT) is used to correct the photo mask layout hotspot regions. In some embodiments, the outcome of correcting the first hotspot region includes one or more parameters for correcting the other hotspot regions of the same hotspot group.

In some embodiments, neighboring hotspots of the photo mask layout are gathered into a hotspot region. A fuzzy match operation may be used to classify the hotspots. Similar hotspots are classified in the same group. A seed region, e.g., a hotspot region, from each hotspot group is selected. A first ILT may be used to correct each selected seed. The results of the first ILT is stored in a memory such as storage 150 of FIGS. 4 and 5. Next, a second ILT is performed on each of the other hotspot regions in the group using the results from the first ILT as an initial correction. All the results of the first and second ILT are merged into the photo mask layout in some embodiments. In each hotspot group, the hotspot regions are the same as or similar to the seed hotspot region in that group. Thus, the iteration counts of the second ILT may significantly be reduced.

In some embodiments, the inspection of the photo mask layout is performed after an optical proximity correction operation. In some embodiments, hotspots are identified during the inspection. The hotspots include areas where there is not sufficient spacing between pattern features after optical proximity correction is performed. In some embodiments, the correction operation includes modifying the layout pattern in the photo mask layout after optical proximity correction. In some embodiments, the hotspots correspond to defective areas, e.g., pinching and/or bridging, that are produced on a wafer when the photo mask layout is projected on a wafer as shown in FIG. 1. In some embodiments, the photo mask layout projection is a simulated projection.

As described herein, in some embodiments, correcting a photo mask using ILT is performed after OPC is performed. In some embodiments, distributed processing may be used to implement ILT and each hotspot group may be processed by a separate processor to reduce a turn-around time.

In some embodiments, a fuzzy match operation may be used for grouping similar hotspots. The fuzzy match may use a fuzzy logic for classifying the similar hotspots.

It will be understood that not all advantages have been necessarily discussed herein, no particular advantage is required for all embodiments or examples, and other embodiments or examples may offer different advantages.

According to some embodiments of the present disclosure, a method of manufacturing a semiconductor device includes receiving a plurality of hotspot regions of a mask layout corresponding to the semiconductor device. The method includes classifying the plurality of hotspot regions into two or more hotspot groups such that same or similar hotspot regions are classified into same hotspot groups and the hotspot groups include a first hotspot group with at least two hotspot regions. The method also includes correcting a first hotspot region of the first hotspot group to generate an enhancement of the first hotspot region of the first hotspot group. The method further includes correcting other hotspot regions of the first hotspot group using the enhancement of the first hotspot region of the first hotspot group to generate enhancements of other hotspot regions of the first hotspot group. The two or more hotspot groups includes a second hotspot group having at least two hotspot regions, the method further includes correcting a first hotspot region of the second hotspot group to generate an enhancement of the first hotspot region of the second hotspot group and correcting other hotspot regions of the second hotspot group using the enhancements to the first hotspot region of the second hotspot group to generate enhancements to other hotspot regions of the second hotspot group, and incorporating the enhancement of the hotspot regions of the first and second hotspot groups into the mask layout to generate an enhanced mask layout. The plurality of hotspot regions generate a plurality of defective areas when the mask layout is projected on a wafer and the enhanced mask layout does not generate a defective area, when projected on the wafer. A defective area on the wafer includes a pinching, a bridging, or both. The method further includes projecting the mask layout on the wafer, inspecting the projected mask layout on the wafer to determine the plurality of defective areas, determining a plurality of hotspots of the mask layout corresponding to the plurality of defective areas, and combining neighboring hotspots into a hotspot region. A fuzzy match operation is used to classify the same or similar hotspot regions into the same hotspot groups. Inverse lithography technology is used to correct the hotspot regions. The method further includes performing an iterative correction of the first hotspot region of the first hotspot group based on a first predetermined enhancement as an initial enhancement, performing the iterative correction until a predefined goal is reached and the enhancement of the first hotspot region of the first hotspot group is generated, and performing iterative correction of the other hotspot regions of the first hotspot group based on the enhancement of the first hotspot region as the initial enhancement, the iterative correction of the other hotspot regions of the first hotspot group is performed until a goal is reached and the enhancements of the other hotspot regions of the first hotspot group are generated. The method also includes storing the enhancement of the first hotspot region of the first hotspot group in a storage memory, and retrieving the enhancement of the first hotspot region of the first hotspot group from the storage memory as the initial enhancement for performing iterative correction of the other hotspot. regions of the first hotspot group According to some embodiments of the present disclosure, a method of manufacturing a semiconductor device includes receiving a photo mask layout corresponding to the semiconductor device. The method includes performing optical proximity correction on the photo mask layout to generate a first corrected photo mask layout and projecting the first corrected photo mask layout on a wafer to generate a first projected photo mask layout. The method also includes inspecting the first projected photo mask layout on the wafer to determine a plurality of defective areas, determining a plurality of hotspots of the first corrected photo mask layout corresponding to the plurality of defective areas, and combining neighboring hotspots into a plurality of hotspot regions. The method further includes classifying the plurality of hotspot regions into two or more hotspot groups such that same or similar hotspot regions are classified into same hotspot groups and the hotspot groups have a first hotspot group with at least two hotspot regions. The method includes correcting a first hotspot region of the first hotspot group to generate an enhancement of the first hotspot region of the first hotspot group and correcting other hotspot regions of the first hotspot group using the enhancement of the first hotspot region of the first hotspot group to generate enhancements of other hotspot regions of the first hotspot group. The method also includes incorporating the enhancement of the hotspot regions of the first hotspot group into the first corrected photo mask layout to generate a second enhanced photo mask layout. The two or more hotspot groups includes a second hotspot group having at least two hotspot regions, the method further includes correcting a first hotspot region of the second hotspot group to generate an enhancement of the first hotspot region of the second hotspot group, correcting other hotspot regions of the second hotspot group using the enhancements to the first hotspot region of the second hotspot group to generate enhancements to other hotspot regions of the second hotspot group, and incorporating the enhancement of the hotspot regions of the second hotspot group into the second enhanced photo mask layout. Projecting the first corrected photo mask layout on the wafer is a simulated projection. A fuzzy match operation is used to classify the same or similar hotspot regions into the same hotspot groups.

According to some embodiments of the present disclosure, a method of manufacturing a semiconductor device includes receiving a plurality of hotspot regions of a mask layout corresponding to the semiconductor device. The method includes classifying the plurality of hotspot regions into two or more hotspot groups such that same or similar hotspot regions are classified into same hotspot groups. The method also includes performing an iterative correction of a first hotspot region of each one of the hotspot groups. The iterative correction uses a first enhancement corresponding to each one of the hotspot groups as an initial enhancement and performs the iterative correction until a goal is reached and an enhancement of the first hotspot region of each one the hotspot groups are generated. The method further includes performing the iterative correction of the other hotspot regions of each one of the hotspot groups using the enhancement of the first hotspot region of each one the hotspot groups as the initial enhancement. The iterative correction is performed until the goal is reached. By reaching the goal, the enhancement of the other hotspot regions of each one of the hotspot groups are generated.

According to some embodiments of the present disclosure, a layout detection and correction system includes a hotspot collector that identifies a plurality of hotspot regions in a mask layout. The layout detection and correction system includes a classifier to classify the plurality of hotspot regions of the mask layout into hotspot groups. The same and similar hotspot regions are classified into same hotspot groups. The layout detection and correction system also includes a layout corrector to correct an identified first hotspot region in a first hotspot group to generate an enhancement of the first hotspot region of the first hotspot group. The layout corrector uses the enhancement of the first hotspot region of the first hotspot group to correct other hotspot regions in the first hotspot group and to generate enhancements to other hotspot regions of the first hotspot group. The layout corrector corrects an identified first hotspot region in a second hotspot group to generate an enhancement of the first hotspot region of the second hotspot group, and uses the enhancement of the first hotspot region of the second hotspot group to correct other hotspot regions in the second hotspot group and to generate enhancements to other hotspot regions of the second hotspot group. The layout detection and correction system also includes a storage memory to store the enhancement of the first hotspot region of the first hotspot group and to store the enhancement of the first hotspot region of the second hotspot group. The layout detection and correction system includes a mask merger to incorporate the enhancements of the hotspot regions of the first hotspot group and the enhancements of the hotspot regions of the second hotspot group into the mask layout to generate an enhanced mask layout. The classifier uses a fuzzy match operation to classify the same or similar hotspot regions in the same hotspot groups. The layout corrector uses inverse lithography technology to correct the hotspot regions. The layout detection and correction system also includes a defect detector to inspect a projected mask layout on a wafer to determine a plurality of defective areas, the hotspot collector identifies a plurality of hotspots of the mask layout corresponding to the plurality of defective areas, and the hotspot collector combines neighboring hotspots into the plurality of hotspot regions.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a photo mask for a semiconductor device, comprising:
   receiving a plurality of hotspot regions of a mask layout corresponding to the semiconductor device;
   classifying the plurality of hotspot regions into two or more hotspot groups that comprise a first hotspot group having at least two hotspot regions, wherein same or similar hotspot regions are classified into same hotspot groups;
   generating an enhancement of a first hotspot region of the first hotspot group; and
   iteratively correcting other hotspot regions of the first hotspot group based on the enhancement of the first hotspot region, as an initial enhancement, to generate enhancements of other hotspot regions of the first hotspot group.

2. The method of claim 1, wherein the two or more hotspot groups comprise a second hotspot group having at least two hotspot regions, the method further comprising:
   correcting a first hotspot region of the second hotspot group to generate an enhancement of the first hotspot region of the second hotspot group;
   correcting other hotspot regions of the second hotspot group using the enhancements to the first hotspot region of the second hotspot group to generate enhancements to other hotspot regions of the second hotspot group; and
   incorporating the enhancement of the hotspot regions of the first and second hotspot groups into the mask layout to generate an enhanced mask layout.

3. The method of claim 2, wherein the plurality of hotspot regions generate a plurality of defective areas when the mask layout is projected on a wafer, and wherein the enhanced mask layout does not generate a defective area, when projected on the wafer.

4. The method of claim 3, further comprising:
   projecting the mask layout on the wafer;
   inspecting the projected mask layout on the wafer to determine the plurality of defective areas;
   determining a plurality of hotspots of the mask layout corresponding to the plurality of defective areas; and
   combining neighboring hotspots into a hotspot region.

5. The method of claim 1, wherein a fuzzy match operation is used to classify the same or similar hotspot regions into the same hotspot groups.

6. The method of claim 1, wherein inverse lithography technology is used to correct the hotspot regions.

7. The method of claim 1, further comprising:
   performing an initial iterative correction of the first hotspot region of the first hotspot group, based on a first predetermined enhancement as an initial enhancement;
   performing the initial iterative correction until a goal is reached and the enhancement of the first hotspot region of the first hotspot group is generated; and
   wherein the iterative correction of the other hotspot regions of the first hotspot group is performed until the goal is reached and the enhancements of the other hotspot regions of the first hotspot group are generated.

8. The method of claim 1, further comprising:
   storing the enhancement of the first hotspot region of the first hotspot group in a storage memory; and
   retrieving the enhancement of the first hotspot region of the first hotspot group from the storage memory as the initial enhancement for performing iterative correction of the other hotspot regions of the first hotspot group.

9. A method for manufacturing a photo mask for a semiconductor device, comprising:
   receiving a photo mask layout corresponding to the semiconductor device;
   performing optical proximity correction on the photo mask layout to generate a first corrected photo mask layout;
   projecting the first corrected photo mask layout on a wafer to generate a first projected photo mask layout;
   inspecting the first projected photo mask layout on the wafer to determine a plurality of defective areas;
   determining a plurality of hotspots of the first corrected photo mask layout corresponding to the plurality of defective areas;
   combining neighboring hotspots into a plurality of hotspot regions;
   classifying the plurality of hotspot regions into two or more hotspot groups that comprise a first hotspot group having at least two hotspot regions, wherein same or similar hotspot regions are classified into same hotspot groups;
   performing an initial iterative correction of a first hotspot region of the first hotspot group, based on a first predetermined enhancement as an initial enhancement, to generate an enhancement of the first hotspot region of the first hotspot group;
   iteratively correcting other hotspot regions of the first hotspot group based on the enhancement of the first hotspot region, as the initial enhancement, to generate enhancements of other hotspot regions of the first hotspot group; and
   incorporating the enhancement of the hotspot regions of the first hotspot group into the first corrected photo mask layout to generate a second enhanced photo mask layout.

10. The method of claim 9, wherein the two or more hotspot groups comprise a second hotspot group having at least two hotspot regions, the method further comprising:
    correcting a first hotspot region of the second hotspot group to generate an enhancement of the first hotspot region of the second hotspot group;
    correcting other hotspot regions of the second hotspot group using the enhancements to the first hotspot region of the second hotspot group to generate enhancements to other hotspot regions of the second hotspot group; and
    incorporating the enhancement of the hotspot regions of the second hotspot group into the second enhanced photo mask layout.

11. The method of claim 9, wherein projecting the first corrected photo mask layout on the wafer is a simulated projection.

12. The method of claim 9, wherein a fuzzy match operation is used to classify the same or similar hotspot regions into the same hotspot groups.

13. The method of claim 9, wherein a defective area on the wafer comprises a pinching, a bridging, or both.

14. A system comprising:
    a hotspot collector configured to identify a plurality of hotspot regions in a mask layout when the mask layout is projected on a wafer;
    a classifier configured to classify the plurality of hotspot regions of the mask layout into hotspot groups, wherein same or similar hotspot regions are classified into same hotspot groups;

a layout corrector configured to:
   correct an identified first hotspot region in a first hotspot group to generate an enhancement of the first hotspot region of the first hotspot group, and
   iteratively correct other hotspot regions of the first hotspot group, based on the enhancement of the first hotspot region, as an initial enhancement, to generate enhancements to other hotspot regions of the first hotspot group; and
a mask projection system configured to facilitate optical projection of the mask layout on a wafer.

15. The system of claim 14, wherein the layout corrector is further configured to correct an identified first hotspot region in a second hotspot group to generate an enhancement of the first hotspot region of the second hotspot group, and use the enhancement of the first hotspot region of the second hotspot group to correct other hotspot regions in the second hotspot group and to generate enhancements to other hotspot regions of the second hotspot group.

16. The system of claim 15, further comprising a storage memory to store the enhancement of the first hotspot region of the first hotspot group and to store the enhancement of the first hotspot region of the second hotspot group.

17. The system of claim 15, further comprising a mask merger configured to incorporate the enhancements of the hotspot regions of the first hotspot group and the enhancements of the hotspot regions of the second hotspot group into the mask layout to generate an enhanced mask layout, wherein the mask projection system is configured to optically project the enhanced mask layout on the wafer.

18. The system of claim 14, wherein the classifier is configured to use a fuzzy match operation to classify the same or similar hotspot regions in the same hotspot groups.

19. The system of claim 14, wherein the layout corrector is configured to use inverse lithography technology to correct the hotspot regions.

20. The system of claim 14, further comprising a defect detector configured to inspect a projected mask layout on a wafer to determine a plurality of defective areas, wherein the hotspot collector is configured to identify a plurality of hotspots of the mask layout corresponding to the plurality of defective areas, and wherein the hotspot collector is configured to combine neighboring hotspots into the plurality of hotspot regions.

* * * * *